US012666673B2

(12) United States Patent
Rahimo et al.

(10) Patent No.: US 12,666,673 B2
(45) Date of Patent: Jun. 23, 2026

(54) SEMICONDUCTOR DEVICE

(71) Applicant: mqSemi AG, Zug (CH)

(72) Inventors: Munaf Rahimo, Gaensbrunnen (CH);
Iulian Nistor, Niederweningen (CH)

(73) Assignee: MQSEMI AG, Zug (CH)

( * ) Notice: Subject to any disclaimer, the term of this
patent is extended or adjusted under 35
U.S.C. 154(b) by 999 days.

(21) Appl. No.: 17/829,184

(22) Filed: May 31, 2022

(65) Prior Publication Data

US 2022/0384578 A1     Dec. 1, 2022

(51) Int. Cl.
*H10D 62/17*       (2025.01)
*H10D 12/00*       (2025.01)
*H10D 62/10*       (2025.01)
*H10D 64/27*       (2025.01)

(52) U.S. Cl.
CPC ......... *H10D 62/393* (2025.01); *H10D 12/481*
(2025.01); *H10D 62/106* (2025.01); *H10D
62/127* (2025.01); *H10D 64/514* (2025.01)

(58) Field of Classification Search
CPC .. H10D 62/393; H10D 12/481; H10D 62/106;
H10D 62/127; H10D 64/514; H10D
12/032; H10D 12/038; H10D 12/441;
H10D 30/0295; H10D 30/0297; H10D
30/66; H10D 30/668; H10D 64/256;
H10D 12/01
See application file for complete search history.

(56) References Cited

U.S. PATENT DOCUMENTS

2003/0141514 A1* 7/2003 Yamaguchi ............ H10D 30/60
438/137
2010/0327313 A1* 12/2010 Nakamura ........... H10D 62/142
257/133
2014/0332845 A1* 11/2014 Bobde .................. H10D 12/441
438/138

(Continued)

FOREIGN PATENT DOCUMENTS

GB        2585696 A      1/2021
GB        2586158 A      2/2021
GB        2587645 A      4/2021

OTHER PUBLICATIONS

GB Search Report dated Jun. 23, 2021 for GB Application No.
2107762.3.

*Primary Examiner* — Yara B Green
*Assistant Examiner* — Akhee Sarker-Nag
(74) *Attorney, Agent, or Firm* — Tarolli, Sundheim,
Covell & Tummino LLP

(57)                ABSTRACT

A Metal Oxide Semiconductor (MOS) transistor cell design
has multiple trench recesses embedding trench gate elec-
trodes longitudinally extending in a third dimension, with
interconnected first base layer, source regions, and a second
base layer covering portions of the regions between adjacent
trench recesses and longitudinally extending in the same
third dimension. When a control voltage greater than a
threshold value is applied on the trench gate electrodes, no
vertical MOS channels are formable on the trench walls
because each of trench recesses abuts at least one source
regions and a connected highly doped second base layer.
Instead, the charge carriers flow from a singular point within
the source region, into a radial MOS channel formed only on
the lateral walls of those trench regions abutting the first
base layer, but not the higher doped second base layer.

14 Claims, 10 Drawing Sheets

(56)        References Cited

U.S. PATENT DOCUMENTS

2015/0287786 A1*  10/2015  Jeon ..................... H10D 62/142
                                                            438/138
2021/0050345 A1*   2/2021  Tamura .................. H01L 21/77
2021/0104614 A1*   4/2021  Rahimo .............. H10D 12/481
2021/0134989 A1*   5/2021  Rahimo ................ H10D 30/66
2021/0280712 A1*   9/2021  Hoshi ................ H10D 62/127
2021/0376087 A1*  12/2021  Tsui .................. H10D 30/0297
2022/0216331 A1*   7/2022  Rahimo .............. H10D 64/232

* cited by examiner

C-C`

SEMICONDUCTOR DEVICE

CROSS-REFERENCE TO RELATED APPLICATIONS

The present application claims priority to GB Patent Application No. 2107762.3 filed on 31 May 2021. The entirety of this application is hereby incorporated by reference for all purposes.

FIELD OF THE INVENTION

The invention relates to the field of power semiconductor devices. More particularly it relates to a power semiconductor device having multiple transistor cells, with layers of different conductivity types.

BACKGROUND

Improving the electrical performance of power semiconductors like IGBTs and MOSFETs has been the driving force in the industry for the last decades. Various transistor cell designs have been proposed with the goal of improving the electron-hole concentration (plasma concentration) in the device. For IGBTs, typical Trench cell designs are shown in FIGS. 1A and 1B. Both designs can incorporate an enhancement n-type layer for improved plasma concentration as shown in FIG. 1C. A fully functional device (also referred to as "semiconductor chip" or "chip") will be obtained by structuring numerous similar transistor cells on the same starting material wafer.

In prior art, when a suitable control or gate voltage is applied on the trench gate electrodes, which are electrically interconnected, a vertical MOS channel is formed along the lateral walls of the trench recesses embedding the second gate electrodes. These MOS channels provide an unobstructed flow path for electrons from the source regions to the drift layer. Consequently, the device enters the conduction mode or ON-state, and is characterized by an on-state voltage drop smaller than traditional transistor planar cell designs. The length 201 of the vertical MOS channel for each transistor cell is equal to the length of the source regions in contact with the trenches as shown in FIG. 1D.

In order to achieve a large total channel length at chip level, two design approaches are used. A first approach relies on a high density of trenches gates, i.e., mesa widths (trench to trench distance) below few μm's to achieve very low conduction losses, because closely packed trenches can provide a strong barrier to hole drainage and improved reverse bias blocking performance. However, this approach creates numerous other problems, for example large parasitic capacitances of the functional device, and unstable behaviour during the transitions from the ON-state to the OFF-state. A second approach, for each transistor cell, is to increase the length of the source regions in contact with the trenches. To achieve the required total channel length per chip, each of the source regions must be 50 μm or more in length.

In performing detailed TCAD simulations of the prior art transistor cell, the present inventors observed the following phenomenon. Even if the vertical MOS channel is preventing from forming by an additional highly doped second p-base layer, the electron charge carriers from the n source region can be transported to the drift layer through an inversion layer formed on the side walls of the trench recesses embedding the trench gate electrodes. The electrons will flow from the edge of the n source region along the side walls of adjacent trench recesses, in different radial directions, which are defined by the outermost boundary of the first p base layer (i.e., channels). In this case, the length of the channel for each transistor cell is not given anymore by the length of the source region in contact with the trenches, but depends on the point injection from the edge of the source region. The more such injection points are located in a cell by shortening the length of the source regions, the larger will be the total channel length at chip level. This approach will also avoid the limitations of the existing approaches, as explained previously.

SUMMARY

According to a first aspect of the invention, we describe a semiconductor device with multiple transistor cells, each cell comprising a first surface and a second surface separated in a first dimension, wherein an emitter electrode is operatively connected to the first surface and a collector electrode is operatively connected to the second surface, and wherein each transistor cell further comprises:

- a drift layer of a first conductivity type located between the first surface and the second surface;
- a first base layer of a second conductivity type arranged between the drift layer and the emitter electrode, and having a region of maximum surface doping concentration;
- a source region of the first conductivity type located within the first base layer and operatively connected to the emitter electrode, wherein a doping concentration of the source region is greater than a doping concentration of the drift layer, and having a singular point at the surface corresponding to the edge of the ion implantation mask used to form the source region;
- a second base layer of the second conductivity type located within the first base layer and extending deeper than the source region in the first dimension, wherein a doping concentration of the second base layer region is greater than a doping concentration of the first base layer, wherein at least a region of the second base layer is operatively connected to the emitter electrode via a contact opening.

The semiconductor device further comprises:

- a plurality of trench regions longitudinally extending in the third dimension, each comprising a first gate electrode and a first insulating layer, the first insulating layer electrically insulating the first gate electrode from the first base layer, the second base layer, the source region and the drift layer, wherein one or more of trench regions abut a respective source region and the second base layer in contact with this source region;
- a second insulating layer that electrically protects the first base layers, the source regions and the drift layer on the first surface;
- wherein the emitter electrode is separated from the first insulating layer, second insulating layer, first gate electrodes by a third insulating layer.

In a top plane view of the transistor cell, the source region, the first base layer, the second base layer, and the plurality of trench regions extend longitudinally in a third dimension. The first base layer is continuous in the third dimension, while the source region and second base layer are interrupted (structured) in the third dimension. The plurality of trench regions can comprise trenches that are also interrupted in the same third dimension.

Unlike in traditional transistor cells, the MOS channel width per transistor cell will be determined by a segment of a circle arranged uniquely on the lateral trench walls, centred at the singular point of the source region.

Some of the first gate electrodes may be electrically connected to the emitter electrode and/or all or some of the first gate electrodes may be electrically floating.

Optionally, a second gate electrode may be added to provide a planar MOS channel. The second gate electrode is arranged on the emitter side of the drift layer, and is electrically insulated from the first base layer, the source region and the drift layer by the second insulating layer.

The power semiconductor may further be characterized in that the thickness of the second insulating layer is larger than the thickness of the first insulating layer. Alternatively, the chemical composition may be different between the two insulating layers, more specifically the dielectric constant of the first insulating layer may be smaller than that of the second insulating layer.

Alternatively, the first and second gate electrodes may not be electrically connected with each other, i.e., the second gate electrode may be made floating or can be grounded, while the first gate electrode remains controlled by a gate potential.

All or some of the second gate electrodes may be electrically connected to the emitter electrode and/or all or some of the second gate electrodes may be electrically floating.

We also describe a power semiconductor device comprising a buffer layer of the first conductivity type with a higher doping concentration than the drift layer, which buffer layer is arranged on the collector side between the drift layer and the collector electrode; and a collector layer of the second conductivity type, which is arranged on the collector side between the buffer layer and the collector electrode.

The power semiconductor device may comprise an enhancement layer of the first conductivity type arranged between, and thereby separating, the drift layer and the first base layer. The role of this enhancement layer is to provide a barrier to the flow of minority charge carriers, thus increasing the concentration of the charge carriers in the drift layer, and thus reducing the losses in ON-state.

The power semiconductor may be a reverse conducting type device with a collector short layer of the first conductivity type arranged at the collector side between the collector electrode and buffer layer.

A distance between adjacent trenches in the second dimension extends approximately in a range from about 20 µm to about 1 µm, preferably from 5 µm to 1 µm, and more preferably from 2 µm to 1 µm.

The power semiconductor device may have an interrupted stripe layout design or cellular layout design.

We also describe herein a semiconductor module package comprising a single or multiple power semiconductor devices as described above. We also describe herein a converter with a plurality of power semiconductor devices arranged in power modules.

It is an object of the invention to provide a power semiconductor device with reduced on-state losses, low drainage of holes, stable gate parameters, improved blocking capability, and good controllability.

It may also be an object of the present invention to provide a Trench Insulated Gate Bipolar Transistor IGBT with improved electrical characteristics.

These objects may be met by the subject matter of the independent claims. Embodiments of the invention are described with respect to the dependent claims.

It will be understood that the first dimension corresponds to the direction of the separation of the emitter and collector electrodes, while the second dimension corresponds to the direction of the length of the trench regions. It will be further understood that the device may extend in a third dimension orthogonal to the first and second dimensions. The first, second and third dimensions generally align with the X, Y and Z dimensions respectively as shown in figures.

The new transistor cell design offers a wide range of advantages both in terms of performance (reduced losses, improved controllability and reliability), and processability (very narrow mesa design rules, reliable process compatibility) with the potential of applying enhanced layer or reverse conducting structures. The inventive design is suitable for full or partial stripes designs, but can also be implemented in cellular designs.

The inventive design can be suitable for reverse conducting structures because the elimination of the vertical trench channel in the cell, and the presence of the highly doped second base layer in the trench regions for improved diode on-state losses. The new design can be applied to both vertical and lateral IGBTs and MOSFETs based on silicon or wide bandgap materials such as Silicon Carbide SiC, Gallium Nitride, or even to drift layers comprising "superjunctions" or "charge compensated regions."

BRIEF DESCRIPTION OF THE DRAWINGS

The embodiments of the invention will be explained in more detail in the following text with reference to the attached drawings, in which.

The reference symbols used in the figures and their meaning are summarized in the list of reference symbols. The drawings are only schematically and not to scale.

Generally, alike or alike-functioning parts are given the same reference symbols. The described embodiments are meant as examples and shall not confine the invention.

DETAILED DESCRIPTION

Figure 2:
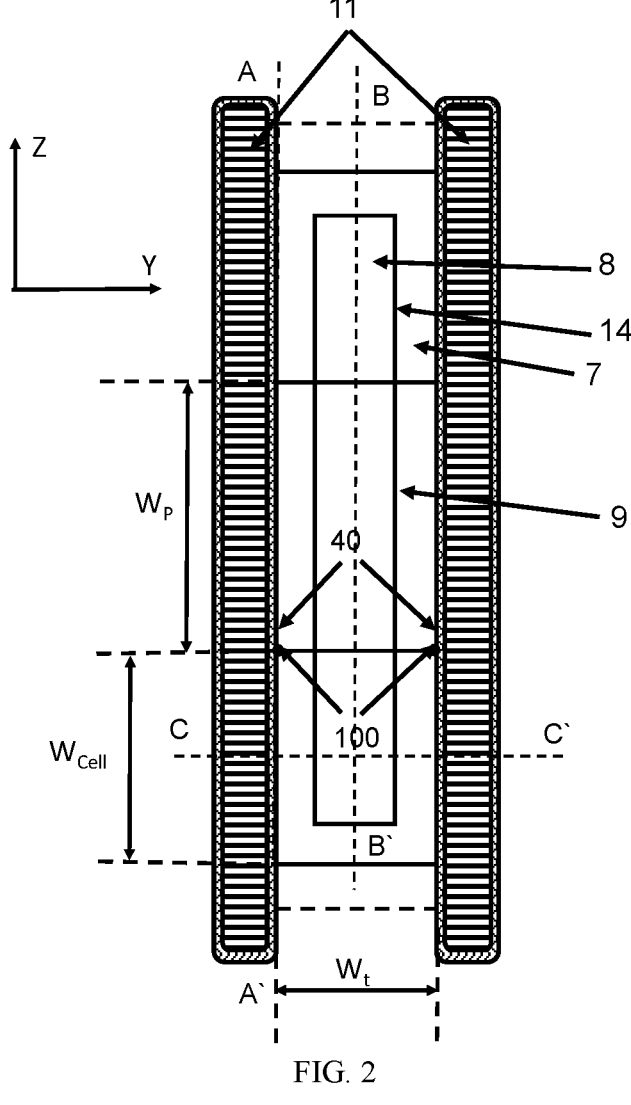
FIG. 2: shows a top plane view of multiple transistor cells of the first exemplary embodiment according to the invention.
Figures 3A, 3B:
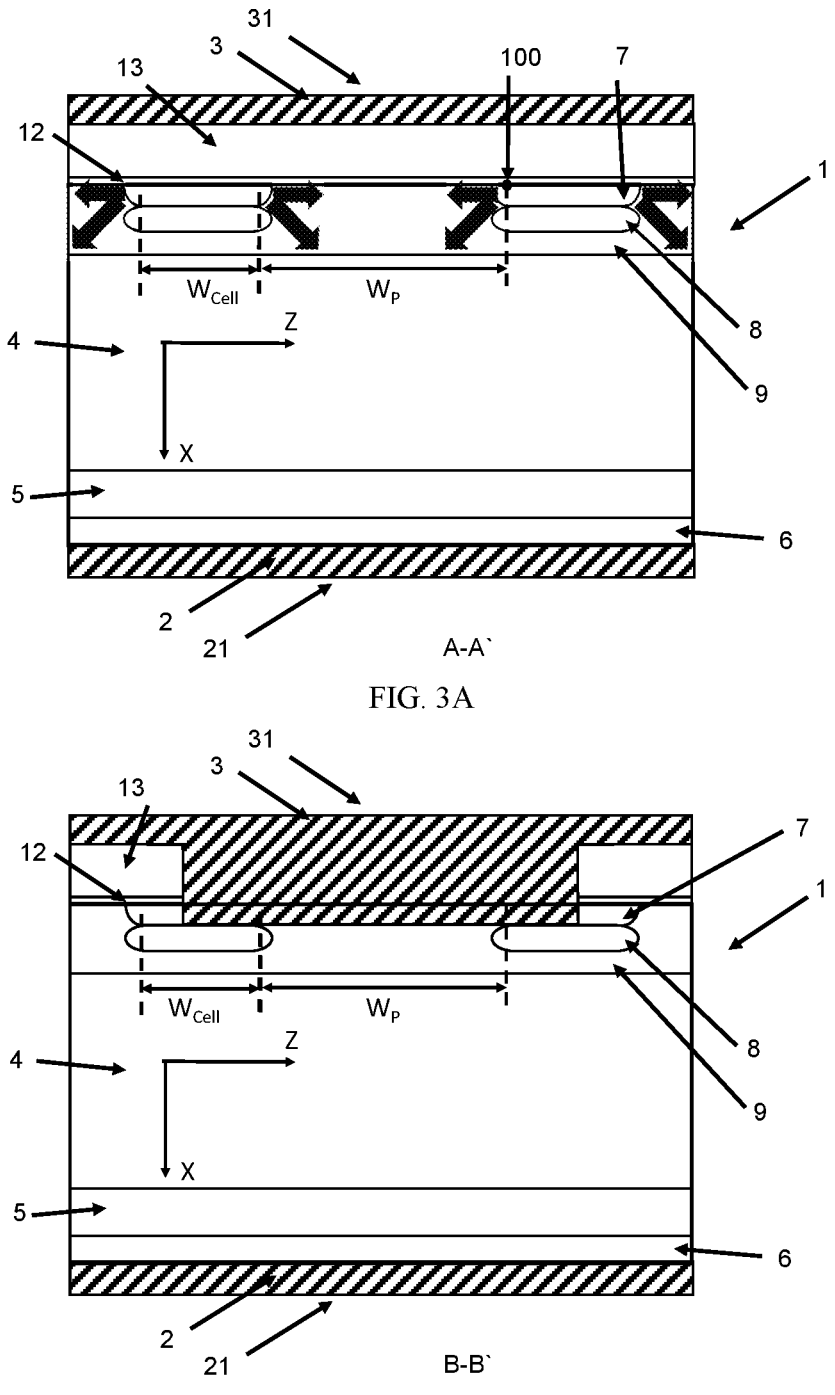
FIG. 3A-C: show the cross sections of transistor cells according to the first exemplary embodiment along the cut-lines A-A', B-B' and C-C' from FIG. 2.
Figure 3C:
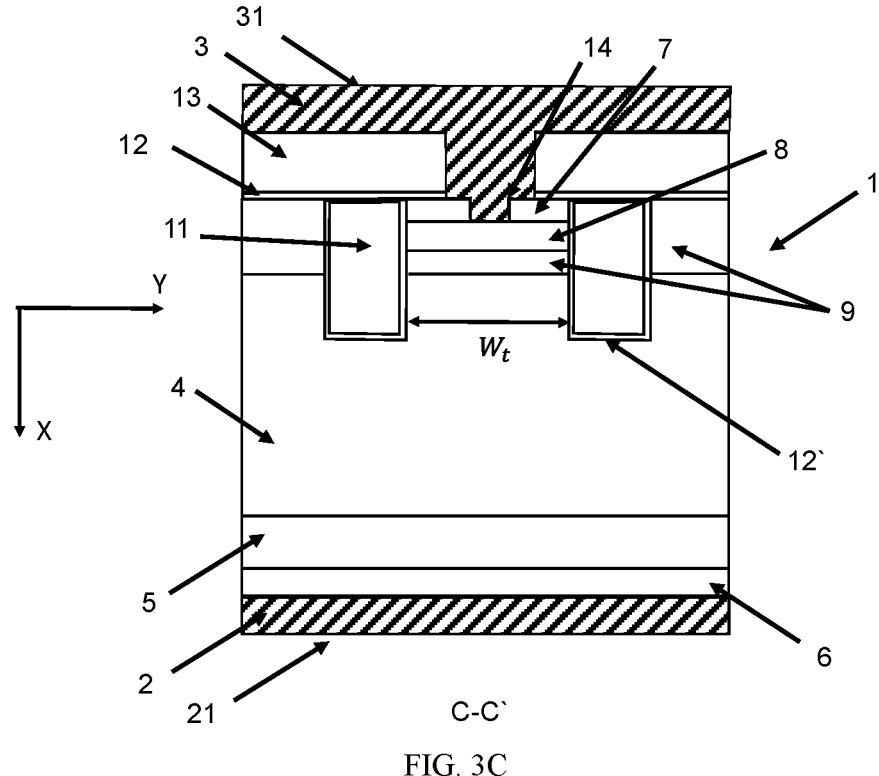

FIG. 2 shows a top view representation, and FIG. 3A-C cross sections of the first exemplary embodiment of two adjacent transistor cells of a semiconductor device 1 in form of a punch through insulated gate bipolar transistor (IGBT) with a four-layer structure (pnpn). FIG. 3A-C show more specific details in cross sections at different cut lines as depicted in FIG. 2. The layers are arranged between an emitter electrode 3 on an emitter side 31 and a collector electrode 2 on a collector side 21, which is arranged opposite of the emitter side 31 in a first dimension. The IGBT transistor cell comprises an (n-) doped drift layer 4, which is arranged between the emitter side 31 and the collector side 21, and a p doped first base layer 9 arranged on the emitter side 31 of the drift layer 4 and extending into the drift layer in the first dimension, and in a top plane view in a third dimension. The transistor cell 1 also comprises an n doped source region 7, which is arranged at the emitter side 31 embedded into the first base layer 9, and directly contacting the emitter electrode 3. The source region 7 has a higher doping concentration than the drift layer 4, and extends in a top plane view in the same third dimension.

Figures 8, 9:
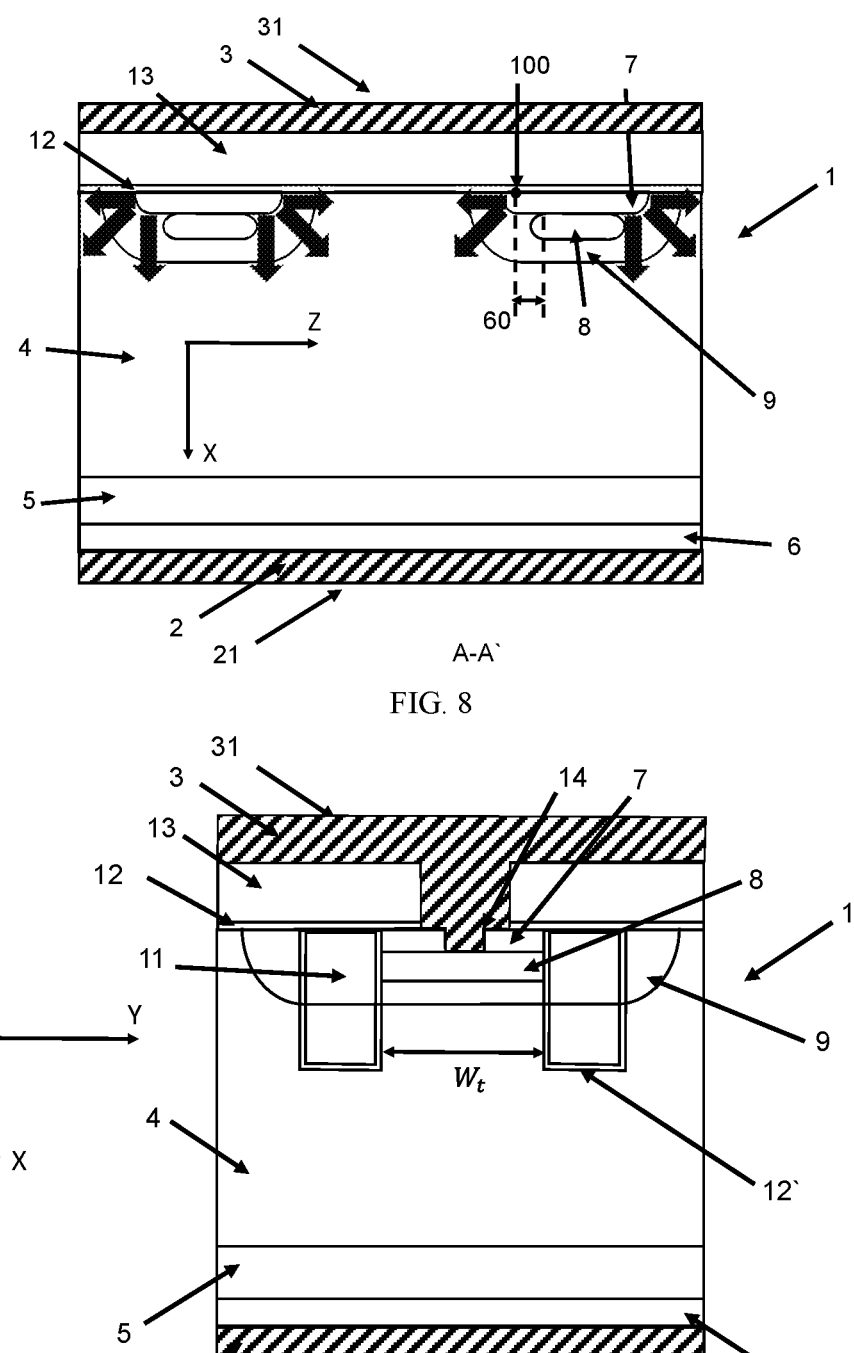
FIG. 8: shows a cross section of the third exemplary embodiment of a transistor cell according to the invention.
FIG. 9: shows a cross section of the fourth exemplary embodiment of a transistor cell according to the invention.

The innovative semiconductor transistor cell 1 further comprises a p doped second base layer 8, which is arranged between the first base layer 9 and the emitter electrode 3, which second base layer 8 is in direct electrical contact to the emitter electrode 3 through a contact opening 14. The second base layer 8 has a higher doping concentration than the first base layer 9. The second base layer 8 extends in the first dimension deeper than the source region, and in a top plane view in the third dimension. In the third dimension (Z-direction), the first edge of the second base layer is spaced apart by a second separation region 60 from the singular point 100 which has a length that can be "0" as represented in FIG. 3B, can be larger than 0 as represented in FIG. 8, or can be negative (not shown).

Furthermore, a plurality of first gate electrodes 11 are embedded in corresponding trench recesses, each electrode 11 being electrically insulated from the first base layer 9, the second base layer 8, the source region 7 and the drift layer 4 by a first insulating layer 12'. The first gate electrodes 11 extend longitudinally in the third dimension, when observed in a top plane view (i.e., a plane perpendicular to the first dimension). In the Y-direction, the trench recesses intersect both source regions 7 and second base layers 8.

A second insulation layer 12 is arranged on the emitter side 31, protecting the surface of the drift layer 4, of the first base layer 9 and of the source region 7.

As the device may comprise one or more transistor cells 1, a fully functional device consists of multiple active trench gates 11, separated by inactive/dummy regions in the second dimension (Y direction). The inactive regions can comprise different structures, known to experts in the field, for example first base layers which are electrically floating or shorted to the emitter electrode, or dummy trenches (embedding electrodes connected to the emitter electrode potential or floating).

In the first exemplary embodiment, a control voltage applied on the first gate electrodes 11 controls the formation of an inversion channel in the first base layer 9. If a positive voltage is applied with a value above a threshold value, an inversion channel is formed only on the active lateral trench walls 40, except in the regions abutting the highly doped second base layer 8, which have higher dopant concentration. No surface inversion layer is formed on the emitter side 31 of the first base layer 9.

The power semiconductor device according to the first exemplary embodiment further comprises a p-doped collector layer 6 arranged between a buffer layer 5 and the collector electrode 2, which collector layer 6 is in direct electrical contact to the collector electrode 2. An n-doped buffer layer 5 is arranged between the collector layer 6 and the drift region 4. A third insulation layer 13 is arranged between the emitter electrode 3 and the first gate electrodes 11. The emitter electrode 3 and the insulating layer 13 are omitted in top plane views of FIG. 2, FIG. 4, and FIG. 12 to better facilitate the visualisation of the underlaying structures.

In a fully functional semiconductor device, multiple transistor cells according to the first exemplary embodiments are arranged adjacent to each other, in the Y- and Z-directions. In the regions between two adjacent transistor cells, it may be possible to implement various other structures such as: dummy trenches (i.e., trench recesses embedding electrodes connected to the emitter electrode 3), or p-base layers that are electrically floating or shorted to the emitter electrode 3 through openings in the second insulating layer 12 and the third insulating layer 13.

In addition, the first exemplary embodiment describes the source region 7, the first base layer 9, the second base layer 8, and the plurality of trench regions extending longitudinally in the Z-direction. In the Z-direction, between two adjacent trench regions, the source region 7 and the second base layer 8 are interrupted at regular intervals, while the first base layer 9 is extending continuously. The contact opening 14 continuously extends in the Z-direction, to connect the two source regions 7 of two adjacent transistor cells.

Figures 4, 5:
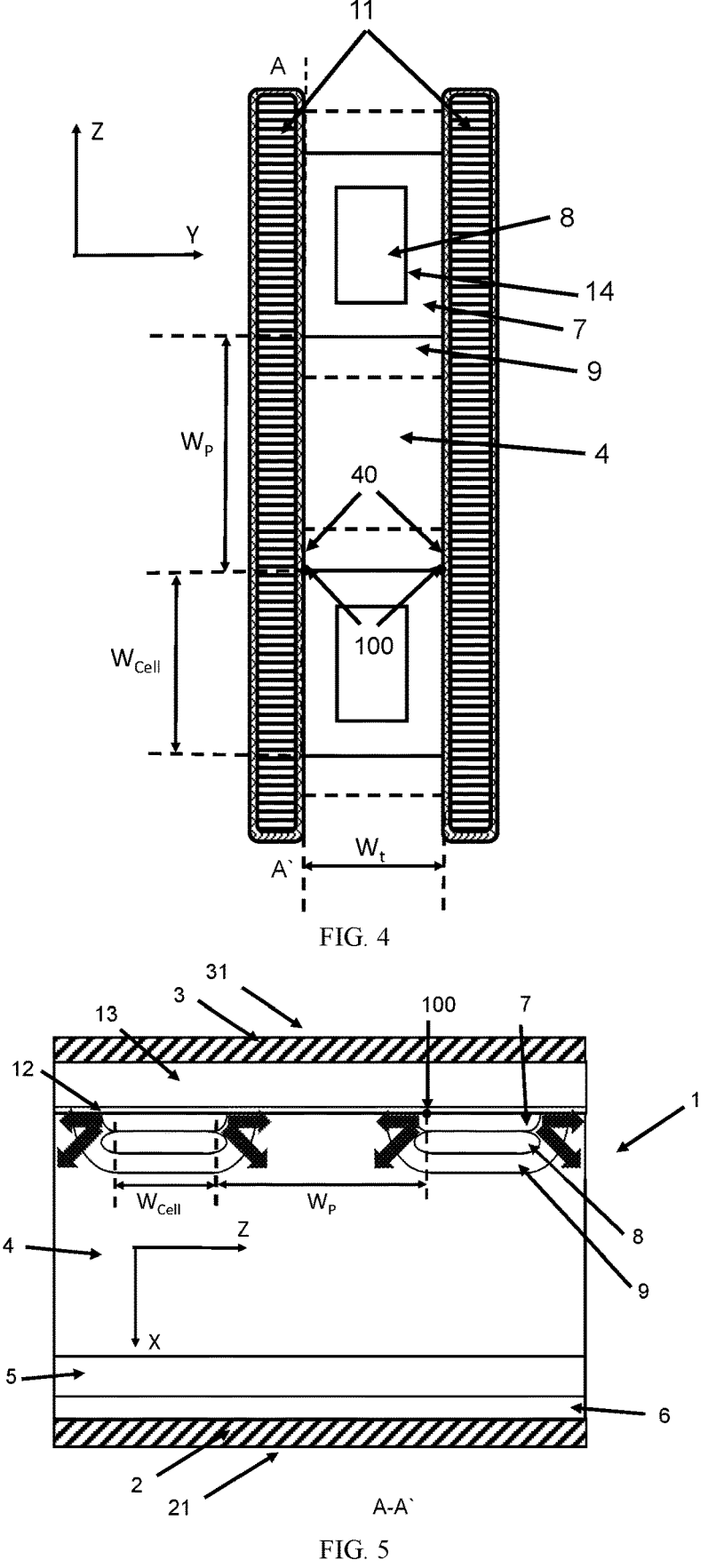
FIG. 4: shows a top plane view of multiple transistor cells of the second exemplary embodiment according to the invention.
FIG. 5: shows the cross sections of transistor cells according to the second exemplary embodiment along the cut-lines A-A' from FIG. 4.

In order to better understand the functionality of a semiconductor device according to the first exemplary embodiment of the invention, a second exemplary embodiment is described in FIG. 4 and FIG. 5, wherein the first base layer is not continuous but is structured in the Z-direction, potentially using the same mask as the source region and the second base layer.

Figure 1A:
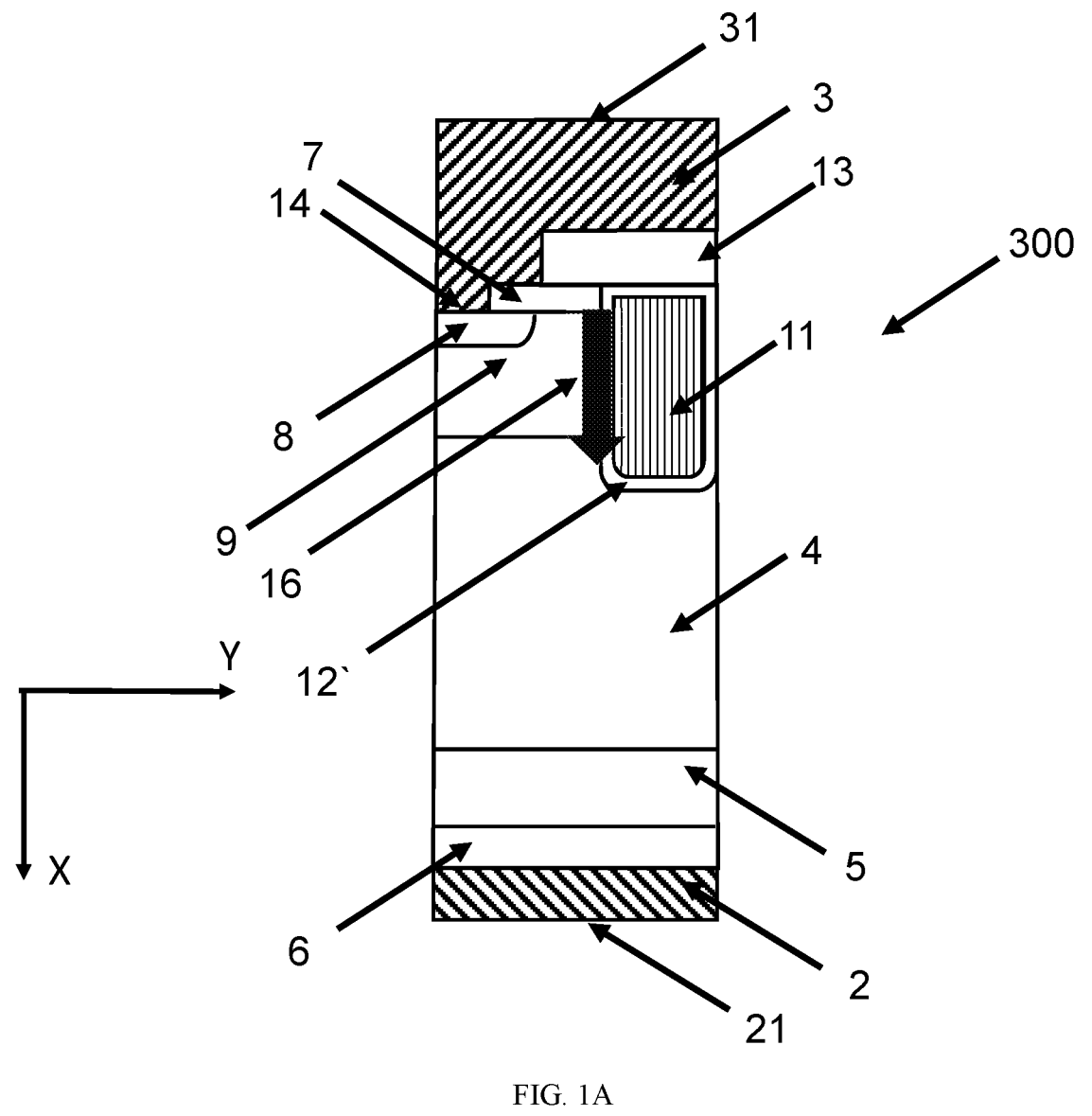
FIG. 1A-B: show the cross sections of Trench MOS IGBT transistor cells (prior art).
Figures 1B, 1C:
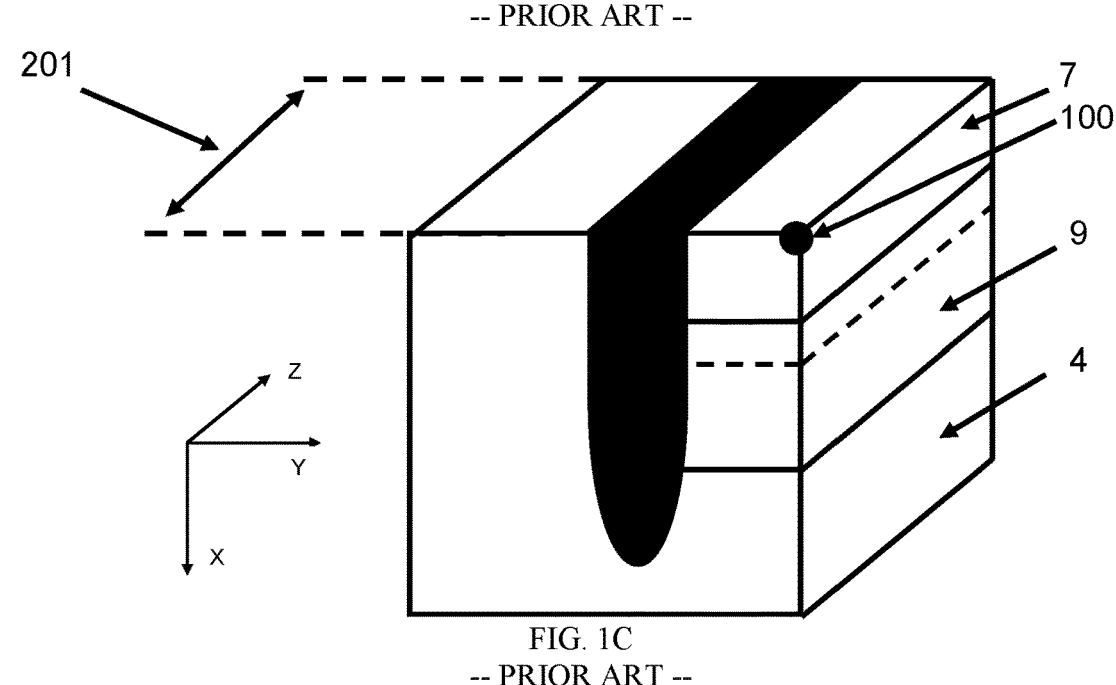
FIG. 1C: shows a three-dimensional representation of Trench MOS IGBT transistor cell (prior art) indicating the channel length

In the case of prior art Planar or Trench type MOSFETs or IGBTs, the effective channel width 201 was defined as the total outermost peripheral boundary of all the n source 7 regions. This approach is applied to various geometrical shapes of the MOS source regions or cells, being it of linear design such as a strip shape or of cellular design. In practice, the channel width 201 is more accurately defined not by the outermost boundary of the n source regions 7, but by the location of maximum surface dopant concentration points in the first base layer 9, which is the point of highest threshold voltage forming an inversion layer. For Trench type transistor cells as depicted in FIG. 1C with a linear design, the width 201 of the MOS channel can be defined simply as the longitudinal extension length of the source region 7 in contact with the trench gate in the third dimension. The total MOS channel width of a given full device comprising a plurality of transistor cells will be the sum of all the channel widths 201 of individual transistor cells.

The first base layer 9 and the source region 7 are usually formed by subsequent steps of implanting ion dopants through a mask. Each ion implant step is followed by thermal annealing and activation of the dopants. Because the two layers 7 and 9 have opposite dopant types, the out diffusion of dopants will locally compensate in all three directions X, Y, Z leading to the formation of a main p-n junction. For silicon-based drift layers, this is depicted schematically in FIG. 6, where it can be seen that the source region 7 will feature a singular point 100 closest to the edge of the mask for source region 7 and first base layer 9 ion implantation. At the singular point 100, the surface doping concentration of the source region 7 reaches a maximum value, after which it starts to decrease towards the p-n junction with the first base layer 9. The singular point 100 is a key feature of the power semiconductor device, as it defines the source region 7 and first base layer 9, and subsequently other key MOS parameters such as the channel width, channel length, threshold voltage, and the maximum doping concentration for supplying the electron charge carriers from the source region 7.

Figure 6:
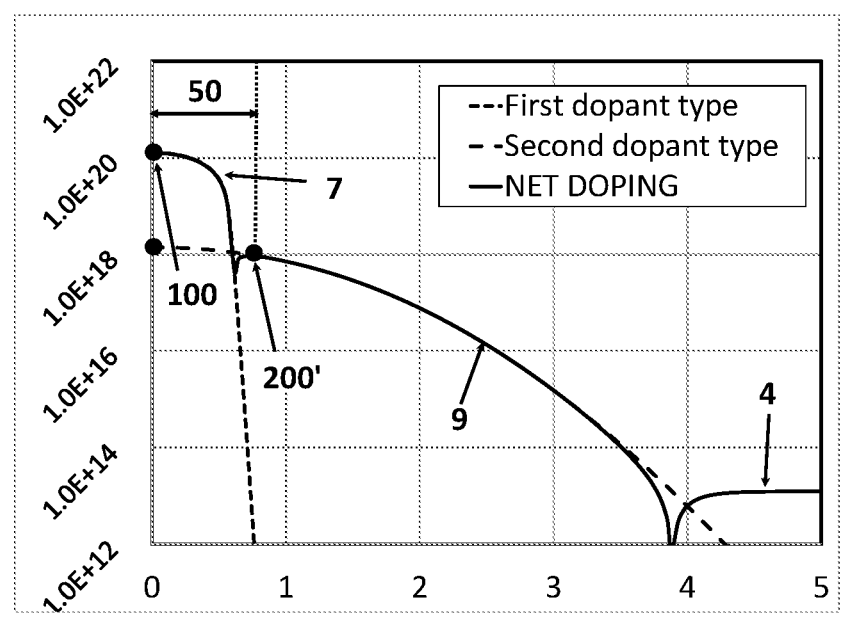
FIG. 6: shows the doping concentration profiles of the source region and first base layer of the second exemplary embodiment, at the emitter surface of the drift layer.

It may be also seen in FIG. 6 that the first base layer 9 will feature a point 200' of maximum dopant concentration near the p-n junction, spaced apart from the singular point 100 by a first separation region 50. This is the point at which the dopant concentration in the first base layer 9 sets the threshold voltage of the power transistor cell 1. In the X-Z plane the points 200' will define a segment of a circle or a quadrant, represented by a dotted line 200 in FIG. 5 which also defines the cell MOS channel width.

Figure 7:
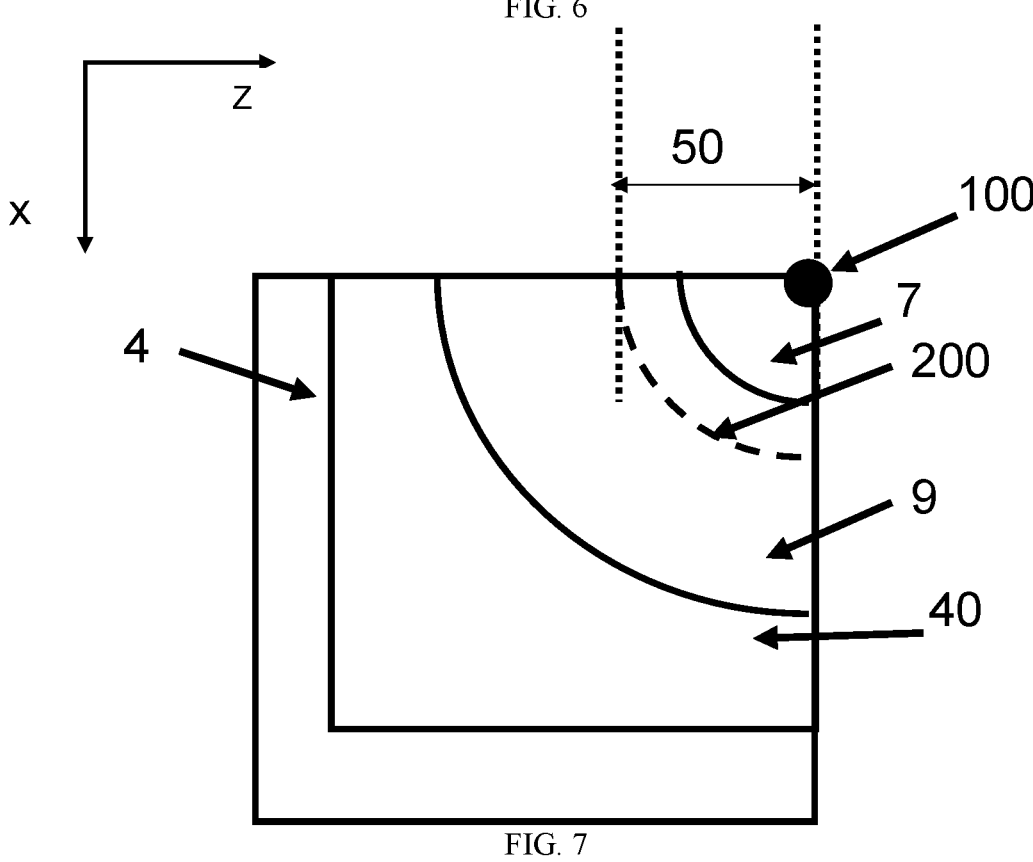
FIG. 7: shows the MOS channel of the second exemplary embodiment along a lateral trench wall

For the first and second exemplary embodiments, the effective width of the MOS channel can be better understood by referencing to the zoomed-in transistor cell details in FIG. 7. In conduction mode, the electron charge carriers are injected from the source region 7 in the inversion layer formed on the active lateral trench walls 40. The cell MOS channel width 200 is more accurately defined as a segment of a circle or a quadrant with the center at the singular point 100, and a radius equal to the length $L_{50}$ of the first separation region 50. This is slightly larger than the outermost peripheral distance of the n source region 7. The region 50 can be between 0.3-1 μm wide, and can be precisely controlled by the use of separate implantation masks for the source region 7, and the first base layer 9.

The single cell MOS channel width $$W_{Cell}^{Ch}$$

can thus be approximated as the length of a quadrant section of a circle centered at the single point 100 with a radius $L_{50}$. Eq. (1) can be thus written as:

$$W_{Cell}^{Ch} = \pi \times L_{50}/2 \tag{1}$$

A fully functional power semiconductor device comprises a plurality of transistor cells 1 with a plurality of MOS channel widths 200, as shown in FIG. 3A or FIG. 5. Thus, the total effective channel width $$W_{total1}^{Ch}$$

can be expressed as Eq. (2):

$$W_{total1}^{Ch} = 4 \times N_{cells} \times W_{Cell}^{Ch} = 2 \times N_{cells} \times \pi \times L_{50}, \tag{2}$$

where $N_{cells}$ represents the total number of active transistor cells over the entire device area (there are 4 active lateral trench walls 40 per transistor cell), and $L_{50}$ is the length of the separation region 50. A typical power semiconductor device may have more than 10,000 active transistor cells in its structure.

In a third exemplary embodiment shown in FIG. 8, the first end of the second base layer 8 is not closely aligned in the third dimension (Z-direction) with the singular point 100 of the corresponding source region 7 that directly contacts the second base layer 8. A second separation region 60 with a length $L_{60}$ different than zero spaces apart the first end of the second base layer 8 from the singular point 100 of the source region 7. As explained previously, this distance can be negative or positive. When $L_{60}$ is positive, it means that the second base layer 8 does not fully protect the bottom side of the source region 7. In the third embodiment, the trench regions abut the second base layer 8 in the second dimension (Y-direction). In a similar manner to the first or second exemplary embodiments, an inversion layer can be formed on the lateral trench walls 40 except in the regions where the trench abuts the highly doped second base layer 8. With reference to the detail in FIG. 6, the effective MOS channel width for a full device can be expressed in this case by Eq.(3):

$$W_{total2}^{Ch} = 4 \times N_{cells} \times \left( \pi \times \frac{L_{50}}{2} + L_{60} \right) \tag{3}$$

When the length of the separation region 60 is greater than 0, the effective channel width is greater than in the first embodiment case defined by Eq. (2).

The proposed concepts provide a large degree of flexibility in selecting various design parameters towards achieving the best possible trade-off.

In the first and second exemplary embodiments, the first base layer 9 is substantially overlapping with the emitter side in both Y- and Z-directions. Thus, the drift layer 4 is not in direct contact with the second insulation layer 12 or the third insulation layer 13 on the emitter side 31. However, in a fourth exemplary embodiment shown in FIG. 9, the first base layer 9 is structured in the Y-direction, i.e., has a limited spatial extension in the Y-direction, or is not uniformly covering the entire emitter surface side of the drift layer. Therefore, in this fourth exemplary embodiment, the drift layer 4 has regions in direct contact with the second insulation layer 12 for example.

With respect to the FIG. 2 showing a top view of two transistor cells according to the first embodiment, the critical design aspects are the dimension $W_t$ or mesa between the trenches in the Y direction, as well as the dimension $W_p$ representing the distance from the singular point 100 of a source region 7 to the singular point 100 of an adjacent source region 7 in the Z direction. Improved carrier storage/reduced hole drainage is expected as the dimension $W_t$ is reduced. More specifically, $W_t$ could extend approximately in a range from about 20 μm to about 1 μm, preferably from 5 μm to 1 μm, and more preferably from 2 μm to 0.1 μm. The value of $W_p$ may be in a range from about 10 μm to below 1 μm, and this value controls the parameter $N_{cells}$. The width of the transistor cell in the Z direction $W_{Cell}$ is defined as the separation between the two singular points of each source region 7, in the Z direction. $W_{Cell}$ can range between 10 μm to below 1 μm, in order to obtain a total channel length at chip level comparable with state-of-art technology. Both dimensions $W_{Cell}$ and $W_P$ are substantially different in the present embodiments, when compared to existing Trench gate transistor designs, in which $W_{Cell}$ can be even larger than 50 µm, and $W_P$ can be larger than 100 µm.

Figures 10, 11:
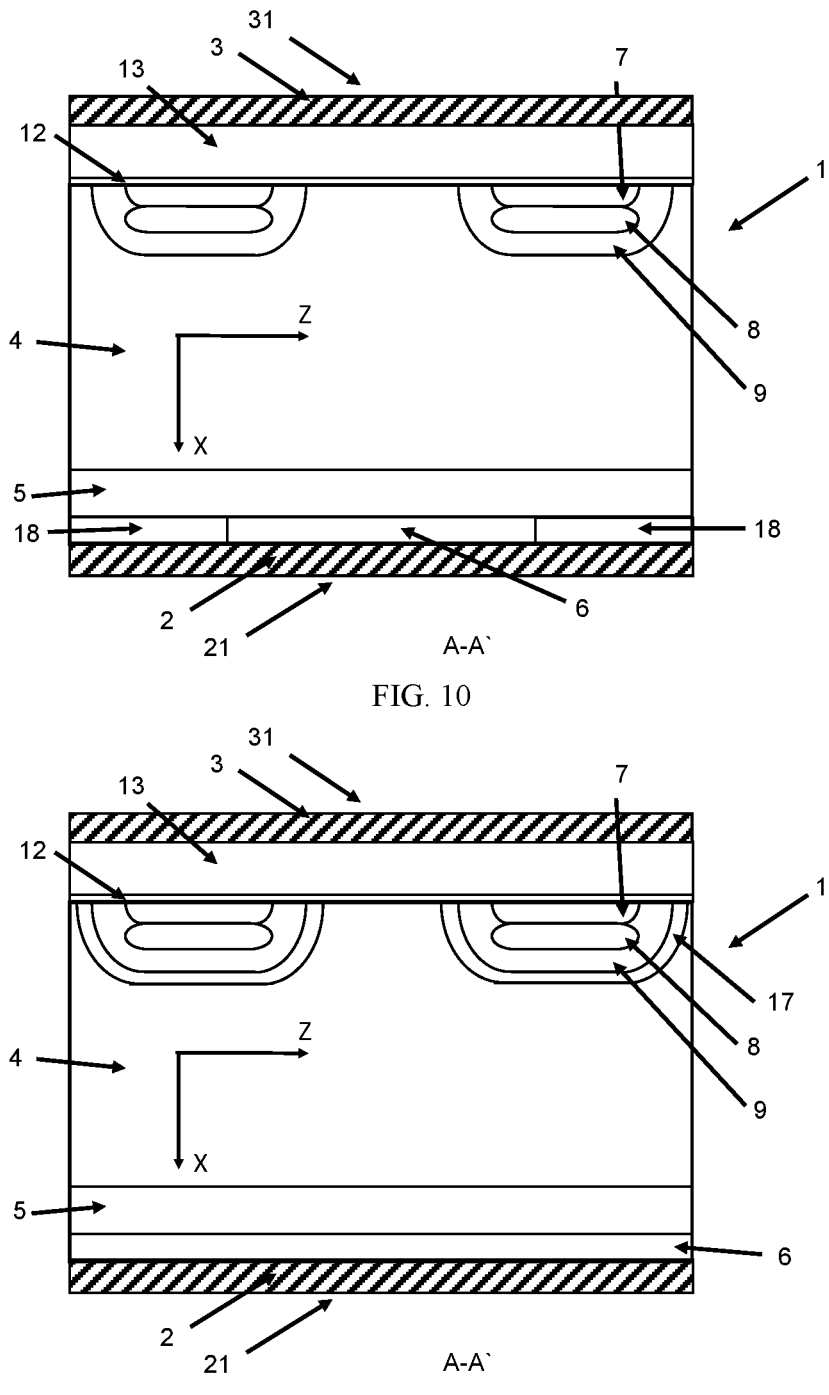
FIG. 10: shows a cross section of the fifth exemplary embodiment of a transistor cell according to the invention.
FIG. 11: shows a cross section of the sixth exemplary embodiment of a transistor cell according to the invention.

A fifth exemplary embodiment shown in FIG. 10, is a reverse conducting type of power semiconductor, wherein the collector layer may be formed of alternating regions of p doped 6 and n doped 18 material. In this case, there will be a diode formed in parallel with the transistor in the same cell. The performance of the diode part will be heavily influenced by the emitter side structure of the transistor cell. With the embodiments disclosed in this patent application, it will be possible to better control the trade-off performance curves for the diode part, without negatively affecting the transistor part.

In a further sixth embodiment depicted in FIG. 11, an n doped enhancement layer 17 may be arranged between the drift layer 4 and the first base layer 9, with the purpose of further enhancing the plasma concentration at the emitter side 31. To achieve this effect, the doping of the layer 17 may be larger than the doping of the drift layer 4.

Figures 12, 13:
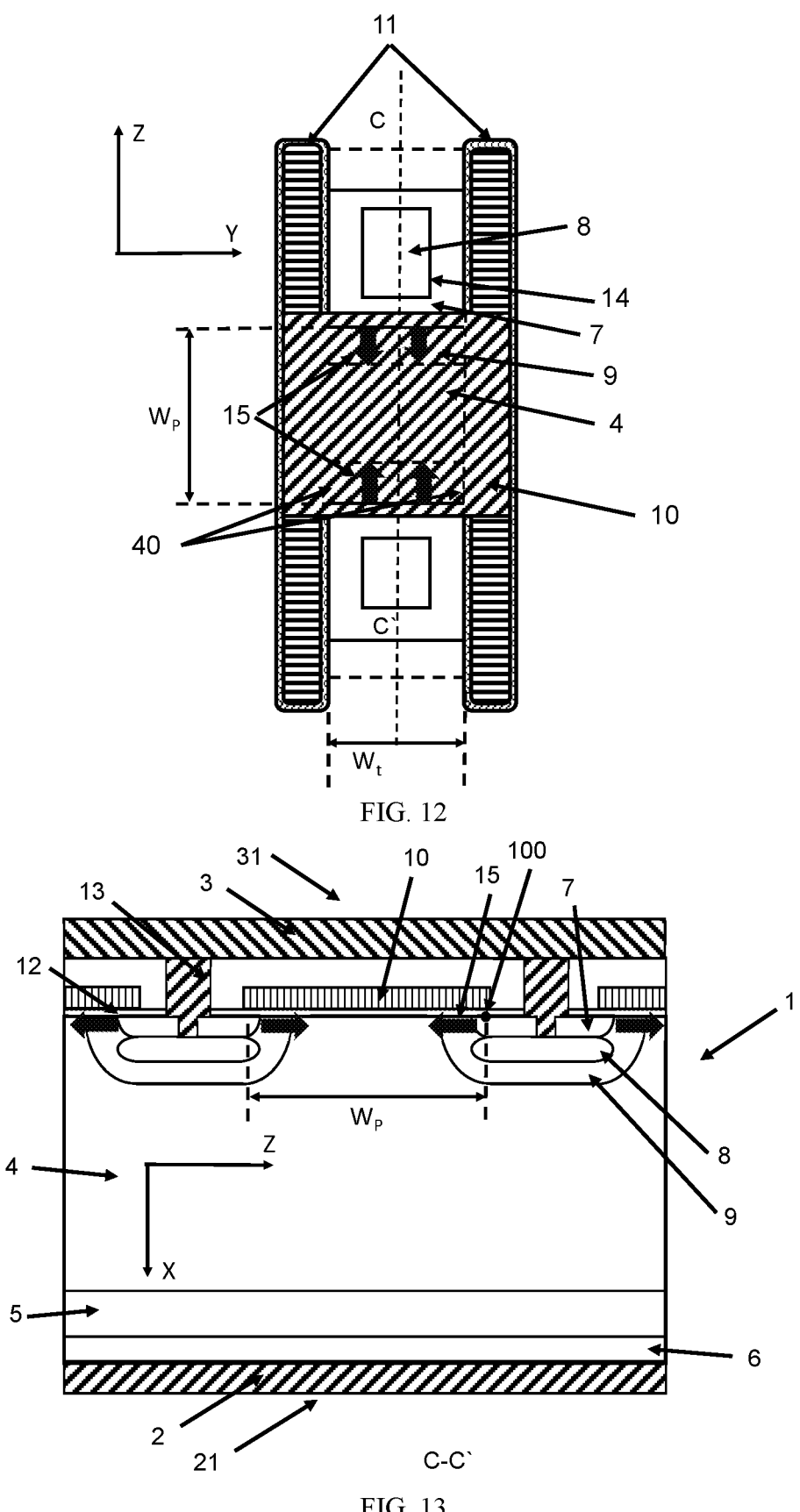
FIG. 12: shows a top plane view of multiple transistor cells according to the seventh exemplary embodiment according to the invention.
FIG. 13: shows a cross section of the seventh exemplary embodiment of two adjacent transistor cells according to the invention.

FIG. 12 shows a seventh exemplary embodiment of a semiconductor device 1. The layers in the eleventh embodiment are arranged between an emitter electrode 3 on an emitter side 31 and a collector electrode 2 on a collector side 21, which is arranged opposite of the emitter side 31 in a first dimension. The IGBT transistor cell according to the seventh embodiment comprises the following layers:

an (n-) doped drift layer 4, which is arranged between the emitter side 31 and the collector side 21, a p doped first base layer 9, which is arranged between the drift layer 4 and the emitter electrode 3, which first base layer 9 extends in a top plane view in a third dimension, an n doped source region 7, which is arranged at the emitter side 31 embedded into the first base layer 9 and contacting the emitter electrode 3, which source region 7 has a higher doping concentration than the drift layer 4, and which source region 7 extends in a top plane view in the third dimension, wherein a first end of the source region 7 is separated in the third dimension from a first end of the first base layer 9, a p doped second base layer 8, which is arranged between the first base layer 9 and the emitter electrode 3, which second base layer 8 is in direct electrical contact to the emitter electrode 3 through a contact opening 14, which second base layer 8 has a higher doping concentration than the first base layer 9, which second base layer 8 extends in the first dimension deeper than the source region, and in a top plane view along the third dimension, a plurality of first gate electrodes 11 embedded in corresponding trench recesses, and electrically insulated from the first base layer 9, the second base layer 8, the source region 7 and the drift layer 4 by a first insulating layer 12', which first gate electrodes 11 extend longitudinally in the third dimension, when observed in a top plane view. The trench recesses intersect source regions 7, and second base layers 8, and a second gate electrode 10, which is arranged on top of the drift layer 4 on the emitter side 31 and is electrically insulated from the first base layer 9, the source region 7 and the drift layer 4 by a second insulating layer 12, and from the emitter electrode 3 by a third insulating layer 13

The first gate electrodes 11 are electrically and physically connected with the second gate electrode 10 at the crosspoints thereof. One or more first gate electrodes 11 can be electrically disconnected from the second gate electrode 10 by the second insulating layer 12, and instead connected with the emitter electrode 3, or be electrically floating (i.e., not contacted)

In the seventh exemplary embodiment, the second gate electrode 10 may be connected to the same control voltage as the first gate electrodes 11. Consequently, an inversion layer can be formed at the emitter side 31 of the first base layer 9, under the second gate electrode 10. Therefore, electrons flow also in planar MOS channels 15, in addition to the lateral walls 40 of the trench regions when the potential of the gate electrode is greater than a threshold value.

In other embodiments, the material of the drift layer may be different than Silicon, for example it may be made of Silicon Carbide, Gallium Nitride, Gallium Oxide, Zinc Oxide or the like. In this case, the same embodiments as described above can be applied, however the specific dimensions and dopant profiles have to be adjusted accordingly by means known to those experts in the field. More specifically, if the drift layer is made of Silicon material, the trench regions may extend vertically to a depth approximately in a range from about 2 µm to about 7 µm. The trench width may range from about 3 µm to about 0.5 µm. However, if the drift layer comprises wide band gap materials such as Silicon Carbide or Gallium Nitride or Gallium Oxide or Zinc Oxide, the depth of the trench recesses can be also smaller than 2 µm.

In addition, for some of the additional embodiments comprising wide bandgap materials, the buffer layer 5 and the collector layer 6 may be omitted, in particular if the power semiconductor device is a MOSFET device with unipolar conduction i.e., majority charge carriers only.

Furthermore, in other embodiments, the drift layer can be formed of plurality of alternating regions shaped as pillars extending in the first dimension, each region comprising a pillar doped with first conductivity type for example p-doped, and an adjacent pillar doped with second conductivity type, which is opposite of the first conductivity type, for example n-type. The respective dopant concentrations and width of the pillars must be carefully selected to ensure perfect charge compensation when integrating the value of the dopants over the extent of each pillar. Such structures are mostly known as superjunction or charge compensated semiconductors.

Furthermore, in other embodiments it may be possible that the power semiconductor is made of a multitude of different transistor cells, but not all cells may be of the same design. For example, the power semiconductor device may be formed with some transistor cells having the first exemplary embodiment, and with some transistor cells having a different design covered in the previous embodiments, or in the prior art.

It is also possible to apply the invention to power semiconductor devices, in which the conductivity type of all layers is reversed, i.e., with a lightly p doped drift layer etc.

REFERENCE LIST

1: inventive semiconductor device cell
3: emitter metallization (electrode)
31: emitter side
2: collector metallization (electrode)
21: collector side
4: drift layer, substrate
5: buffer layer
6: collector layer
7: n source layer 8: p second base layer
9: p first base layer
10: second gate electrode, electrically conductive layer
11: first gate electrode, electrically conductive layer
12: second insulating layer
12': first insulating layer
13: third insulating layer
14: emitter contact opening or contact plug
15: horizontal MOS channel for planar gate
16: vertical MOS channel for trench gate
17: enhancement layer
18: collector shorts
40: active lateral trench wall i.e., inversion layer is formed, and there is contact with the source region
50: separation region between the singular point 100 and the highest doping concentration region in the first base layer (in the second dimension)
60: separation region between the singular point 100 and the first edge of the second base layer (in the second dimension)
70: distance between the singular point in the source region, and the first end wall of an adjacent trench region (in the second dimension)
80: trench width
100: singular point close to the edge of the mask for source region ion implantation, where the surface doping concentration in the source region reaches a maximum value
200: MOS cell channel width according to the invention
200': point of maximum dopant concentration in the first base layer
201: MOS cell channel width (prior art)
300: trench MOS cell power semiconductor device (prior art)

The invention claimed is:

1. A semiconductor device comprising a first surface and a second surface separated in a first dimension of three orthogonal dimensions, wherein an emitter electrode is operatively connected to the first surface and a collector electrode is operatively connected to the second surface, and further comprising:
   a drift layer located between the first surface and the second surface;
   a source region of a first conductivity type operatively connected to the emitter electrode, formed by ion implantation through a source mask, with a doping concentration greater than a doping concentration of the drift layer;
   a first base layer of a second conductivity type opposite of the first conductivity type, extending in the first dimension from the first surface towards the drift layer;
   a second base layer of the second conductivity type located within the first base layer and extending deeper than the source region in the first dimension, having a doping concentration greater than a doping concentration of the first base layer, having at least a point operatively connected to the emitter electrode via a contact opening;
   wherein, each of the source region and the second base layer extend longitudinally in a top plane view in a third dimension,
   a plurality of trench regions longitudinally extending in the third dimension, each trench region comprising a first gate electrode and a first insulating layer, the first insulating layer electrically insulating the first gate electrode from the first base layer, the second base layer, the source region and the drift layer;

a second insulating layer on the first surface of the drift layer in contact with the first base layer, source region and drift layer; and,
   wherein, the second base layer is adjacent to and does not fully surround the source region,
   wherein, the first base layer extends longitudinally in a top plane view and is structured in the third dimension,
   wherein a singular point is defined at a surface of the source region abutting an adjacent trench region from the plurality of trench regions, a surface doping concentration of the source region is at a maximum value, the surface doping concentration of the source region decreases from the singular point to a p-n junction with the first base layer,
   wherein, the first base layer is structured in the third dimension with a first and second edges that extend beyond the first and second edges of the source region, and its position of maximum surface doping concentration is spaced apart, by a first separation region, from the singular point of the source region
   wherein, in the third dimension, the first end of the second base layer and the singular point are spaced apart by a second separation region,
   wherein the effective total channel width $W_{total}$ can be determined by the formula $$W_{total} = 4 \times N_{cells} \times (\pi \times L_{50}/2 + L_{60}),$$

and wherein, $N_{cells}$ is the number of active transistor cells across the plurality of transistor cells,
   $L_{50}$ is the length of the first separation region, and
   $L_{60}$ is the length of the second separation region.

2. The semiconductor device of claim 1 wherein the plurality of trench regions abuts the source region and the second base layer in a second dimension perpendicular to the first and third dimensions, such that the highly doped second base layer prevents charge carriers to flow in the first dimension between the source region and the drift layer, when the voltage applied on the first gate electrodes forms an inversion layer in the first base layer.

3. The semiconductor device of claim 1 included within an arrangement comprising a plurality of semiconductor devices.

4. The semiconductor device of claim 1, wherein the contact opening extends between and connects adjacent transistor cells in the third dimension.

5. The semiconductor device of claim 1 having at least a portion of the drift layer abutting the first surface in the regions between adjacent transistor cells in the second dimension.

6. The semiconductor device of claim 1, wherein a second gate electrode is arranged on the first base layer, the source region and the drift layer, wherein the second gate electrode is electrically insulated from the first base layer, the source region, and the drift layer, by the second insulating layer, and from the emitter electrode by a third insulating layer; wherein the first gate electrodes are operatively connected with the second gate electrode.

7. The semiconductor device of claim 1, wherein at least one of the first gate electrodes is electrically connected to the emitter electrode.

8. The semiconductor device of claim 1, wherein at least one of the first gate electrodes is electrically floating.

9. The semiconductor device of claim 1, further comprising at least one of:

a buffer layer of the first conductivity type located between the drift layer and the collector electrode on the second surface, wherein the doping concentration of the buffer layer is greater than the doping concentration of the drift layer; and a collector layer of the second conductivity type located between the drift layer and the collector electrode on the second surface.

10. The semiconductor device according to claim 9, wherein the semiconductor is a reverse conducting power semiconductor device and the collector layer comprises alternating regions of opposite first and second conductivity types.

11. The semiconductor device of claim 1, wherein an enhancement layer of the first conductivity type is located between the drift layer and the first base layer, and wherein the doping concentration of the enhancement layer is greater than a doping concentration of the drift layer.

12. The semiconductor device of claim 1, wherein the semiconductor has a stripe layout design or cellular layout design in a top view plane.

13. The semiconductor device of claim 1, wherein at least the drift layer is formed of a wide bandgap material.

14. The semiconductor device of claim 1, wherein the drift layer is formed of alternating regions of the first conductivity type and the second conductivity type.

* * * * *